(12) United States Patent
Gotou et al.

(10) Patent No.: US 7,511,575 B2
(45) Date of Patent: Mar. 31, 2009

(54) HIGH-FREQUENCY POWER AMPLIFIER

(75) Inventors: Seiki Gotou, Tokyo (JP); Akira Inoue, Tokyo (JP); Tetsuo Kunii, Tokyo (JP); Toshikazu Oue, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/682,366

(22) Filed: Mar. 6, 2007

(65) Prior Publication Data
US 2008/0094141 A1 Apr. 24, 2008

(30) Foreign Application Priority Data
Oct. 23, 2006 (JP) .............................. 2006-287964

(51) Int. Cl.
*H03F 3/68* (2006.01)
(52) U.S. Cl. .................... 330/295; 330/124 R; 330/286
(58) Field of Classification Search ............. 330/124 R, 330/286, 295, 302
See application file for complete search history.

(56) References Cited

U.S. PATENT DOCUMENTS 6,177,841 B1    1/2001   Ohta et al.
6,201,445 B1 *  3/2001   Morimoto et al. ........... 330/295
6,614,308 B2 *  9/2003   Moller et al. ................ 330/295
7,310,019 B2 * 12/2007   Gotou et al. ................. 330/295

FOREIGN PATENT DOCUMENTS

JP        8-37433       2/1996
JP      2002-43873      2/2002
JP      2005-109651     4/2005

OTHER PUBLICATIONS

Negra, R. e al., "On the design of MMIC multi-harmonic load terminations for class-F amplifiers", Proceedings of the 36th European Microwave Conference, Sep. 2006, pp. 180-183.

* cited by examiner

*Primary Examiner*—Khanh V Nguyen
(74) *Attorney, Agent, or Firm*—Leydig, Voit & Mayer, Ltd.

(57) ABSTRACT

A high-frequency power amplifier has an FET element having a unit FETs in multifinger form, and having a gate pad through which a signal is input, a source pad that is grounded, and a drain pad through which a signal is output. A high-frequency processing circuit includes series resonance circuits shunt-connected between the gate pads of the unit FETs and grounding ends. Two of the series resonance circuits have respective different resonance frequencies which correspond to second and higher harmonics of a frequency included in the operating frequency band of the FET element.

8 Claims, 7 Drawing Sheets

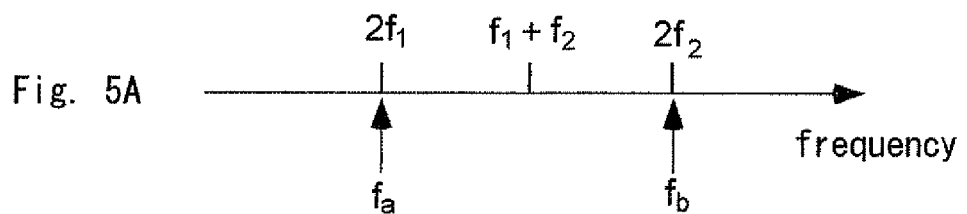
Fig. 5A
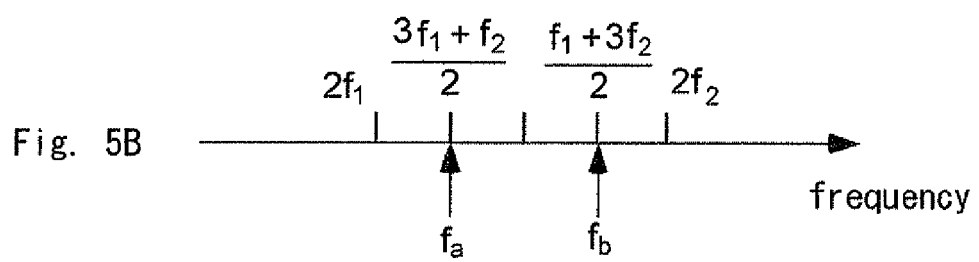
Fig. 5B
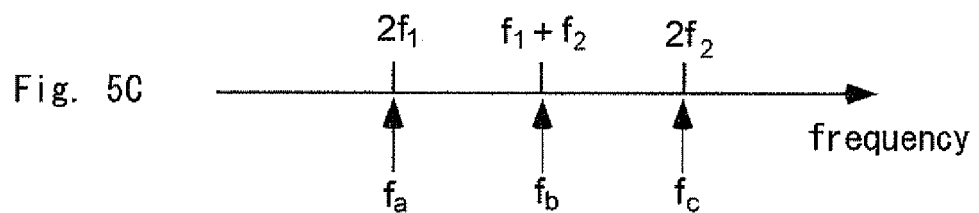
Fig. 5C
Fig. 6
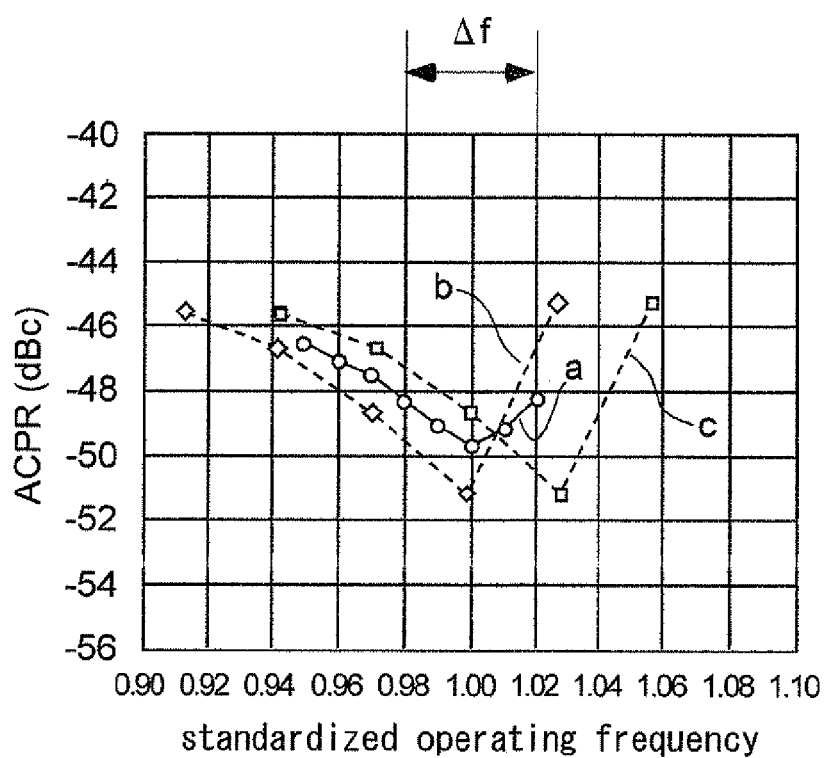

HIGH-FREQUENCY POWER AMPLIFIER

BACKGROUND OF THE INVENTION

1. Field of the Invention

The present invention relates to a high-frequency power amplifier and, more particularly, to a high-frequency power amplifier used, for example, in apparatuses for mobile communication and satellite communication in microwave and milliwave bands, for example, from several megahertz to several hundred gigahertz.

2. Description of the Related Art

In recent years, there has been an increasing demand for communication apparatuses of a smaller size and higher output to be used in microwave and milliwave bands. There has also been an increasing demand for improving the quality of propagated signals. With these demands, a demand has arisen for a high-frequency power amplifier having low-distortion characteristics and having a high efficiency.

In particular, in a microwave communication system using a multicarrier signal or a modulated wave signal according to the code division multiple access (CDMA) system in recent years, an amplifier for signal amplification is used by being operated at an output level much lower than the maximum power such as to avoid the influence of a distortion due to nonlinearity of the amplifier.

In high-output power amplifiers used in ground stations for mobile communication or satellite communication, there is a need to use a transistor element having a large gate width in order to perform high-power amplification. To form such a transistor element, a multiplicity of gate-finger-type transistors are combined by being connected in parallel with each other. In a case where a large-gate-width transistor element is formed by connecting a multiplicity of gate-finger-type transistors connected in parallel with each other, the input and output impedances of the transistor element are necessarily decreased and a matching circuit load for impedance matching to the transistor at the operating frequency of the transistor is extremely small.

It is known that a high-frequency amplifier operates at high efficiency if a load condition close to a short-circuited condition is set with respect to the second harmonic on the input side. However, to provide a load condition close to a short-circuited condition with respect to the second harmonic of the operating frequency for the purpose of operating a large-gate-width transistor element such as high-frequency power amplifier at high efficiency, in addition to setting a matching circuit load of an extremely low impedance with respect to the fundamental of the operating frequency, setting the impedance of the matching circuit load to a further low value with respect to the harmonic of the operating frequency is required.

As a known high-frequency power amplifier, an arrangement has been disclosed in which a circuit formed of a second line having an electrical length substantially equal to the ¼ wavelength with respect to a fundamental frequency and a capacitor are connected in series is provided between a grounding end and a connection point B existing between the gate of a power transistor and an input matching line. This circuit ensures that the impedance of the second line as seen from the point B is substantially zero and the input impedance with respect to the second harmonic can be controlled without influencing the input impedance with respect to the fundamental wave, thereby improving the operation efficiency (see, for example, Japanese Patent Laid-Open No. 8-37433, paragraph No. [0039] and FIG. 2).

As another known high-frequency power amplifier, an arrangement has been disclosed in which GaAs field effect transistors (FETs) formed of semiconductor chips and provided as power amplification devices are respectively disposed in a source grounded state in a first path A and a second path B between an input terminal IN and an output terminal OUT, and in which input and output matching circuits each including a resonance circuit as an equivalent circuit are respectively provided on the input and output sides of each GaAs FET (see, for example, Japanese Patent Laid-Open No. 2005-109651, paragraph No. [0006] and FIG. 1).

Also, as still another known broad-band power amplifier, an arrangement has been disclosed in which band-pass filters having predetermined passbands for determining frequency amplification characteristics are disposed in stages before and after each of three power amplifiers. By disposing these band-pass filters, the three power amplifiers are arranged as narrow-band power amplifiers having such frequency amplification characteristics as to perform amplification in three successive frequency bands (see, for example, Japanese Patent Laid-Open No. 2002-43873, paragraph No. [0006] and FIGS. 1 and 2).

In the power amplifiers described in the above-mentioned patent documents, however, a circuit for controlling harmonics, a resonance circuit or a band-pass filter is disposed on the external circuit side of a transistor element combined as one power transistor or one chip with input and output terminals.

In the case of control of harmonics of a large-gate-width transistor element such as a high-frequency power amplifier, there was a problem that it is difficult to obtain a low-impedance load with respect to harmonics even if a processing circuit for controlling harmonics is added on the external circuit side of each transistor element whose input and output ends are respectively combined as used to be. Further, if the transistor element has an operation frequency bandwidth, second or higher harmonic frequencies are generated in a certain bandwidth as well as operating frequencies and there is a need to control the input load throughout a wide band.

SUMMARY OF THE INVENTION

The present invention has been made to solve the problem, and a first object of the present invention is provide a high-frequency power amplifier having high output efficiency and improved distortion characteristics throughout a wide frequency band.

According to one aspect of the invention, there is provided a high-frequency power amplifier comprising: a transistor element having a plurality of unit transistors on a first semiconductor substrate, each of the unit transistors having a plurality of transistors connected in parallel with each other in multifinger form, and each of the unit transistors having a control terminal through which an input signal is input, a first terminal connected to a constant-potential end, and a second terminal through which an output signal is output; a high-frequency processing circuit having a plurality of first series resonance circuits shunt-connected between the control terminals of the unit transistors of the transistor element and the constant-potential ends, and located on a second semiconductor substrate; first connection line for connecting the plurality of control terminals of the transistor element to each other; second connection line for connecting the plurality of second terminals of the transistor element to each other; an input matching circuit connected to the first connection line; and an output matching circuit connected to the second connection line, wherein two of the first series resonance circuits have resonance frequencies corresponding to the second and higher harmonics of a frequency included in the operating frequency band of the transistor element, and different from each other.

Accordingly, in the high-frequency power amplifier according to the present invention, each first series resonance circuit is shunt-connected between the control terminal of the corresponding unit transistor constituting the transistor element and the constant-potential end and is set so as to resonate with the desired frequency corresponding to the second or higher harmonic of the operating frequency. Therefore, the high-frequency load with respect to the second or higher harmonic of the operating frequency can be easily controlled to a low impedance as seen from the control terminal side of the transistor element. Further, two of the first series resonance circuits have resonance frequencies which correspond to the second and higher harmonics of a frequency included in the operating frequency band of the transistor element, and which are different from each other. Thus, in the high-frequency processing circuit, the first series resonance circuits having different resonance frequencies corresponding to the harmonics of the operating frequency band are mixedly provided, thereby reducing variation in distortion in the operating frequency band in comparison with a case where only resonance circuits of one resonance frequency are provided, and obtaining distortion characteristics stable throughout a comparatively wide band.

According to another aspect of the invention, there is provided a high-frequency power amplifier comprising: a transistor element having a plurality of unit transistors on a first semiconductor substrate, each of the unit transistors having a plurality of bipolar transistors connected in parallel with each other in multifinger form, and each of the unit transistors having a control terminal through which an input signal is input, a first terminal connected to a constant-potential end, and a second terminal through which an output signal is output; a high-frequency processing circuit having a plurality of first series resonance circuits shunt-connected between the control terminals of the unit transistors of the transistor element and the constant-potential ends, and located on a second semiconductor substrate; first connection line for connecting the plurality of control terminals of the transistor element to each other; second connection line for connecting the plurality of second terminals of the transistor element to each other; an input matching circuit connected to the first connection line; and an output matching circuit connected to the second connection line, wherein the first series resonance circuits have resonance frequencies corresponding to the second or higher harmonic of a frequency included in the operating frequency band of the transistor element.

Accordingly, in the high-frequency power amplifier according to the present invention, each first series resonance circuit is shunt-connected between the control terminal of the corresponding unit transistor constituting the transistor element and the constant-potential end and is set so as to resonate with the desired frequency corresponding to the second or higher harmonic of the operating frequency. Therefore, the high-frequency load with respect to the second or higher harmonic of the operating frequency can be easily controlled to a low impedance as seen from the control terminal side of the transistor element.

Other objects and advantages of the invention will become apparent from the detailed description given herein after. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

FIGS. 5A to 5C are diagrams schematically showing the resonance frequencies of the series resonance circuits of the high-frequency power amplifier according to the present invention.

FIG. 6 is a graph showing distortion characteristics of the high-frequency power amplifier according to the present invention with respect to the operating frequency.

In all figures, the substantially same elements are given the same reference numbers.

DESCRIPTION OF THE PREFERRED EMBODIMENTS

First Embodiment

Figure 1:
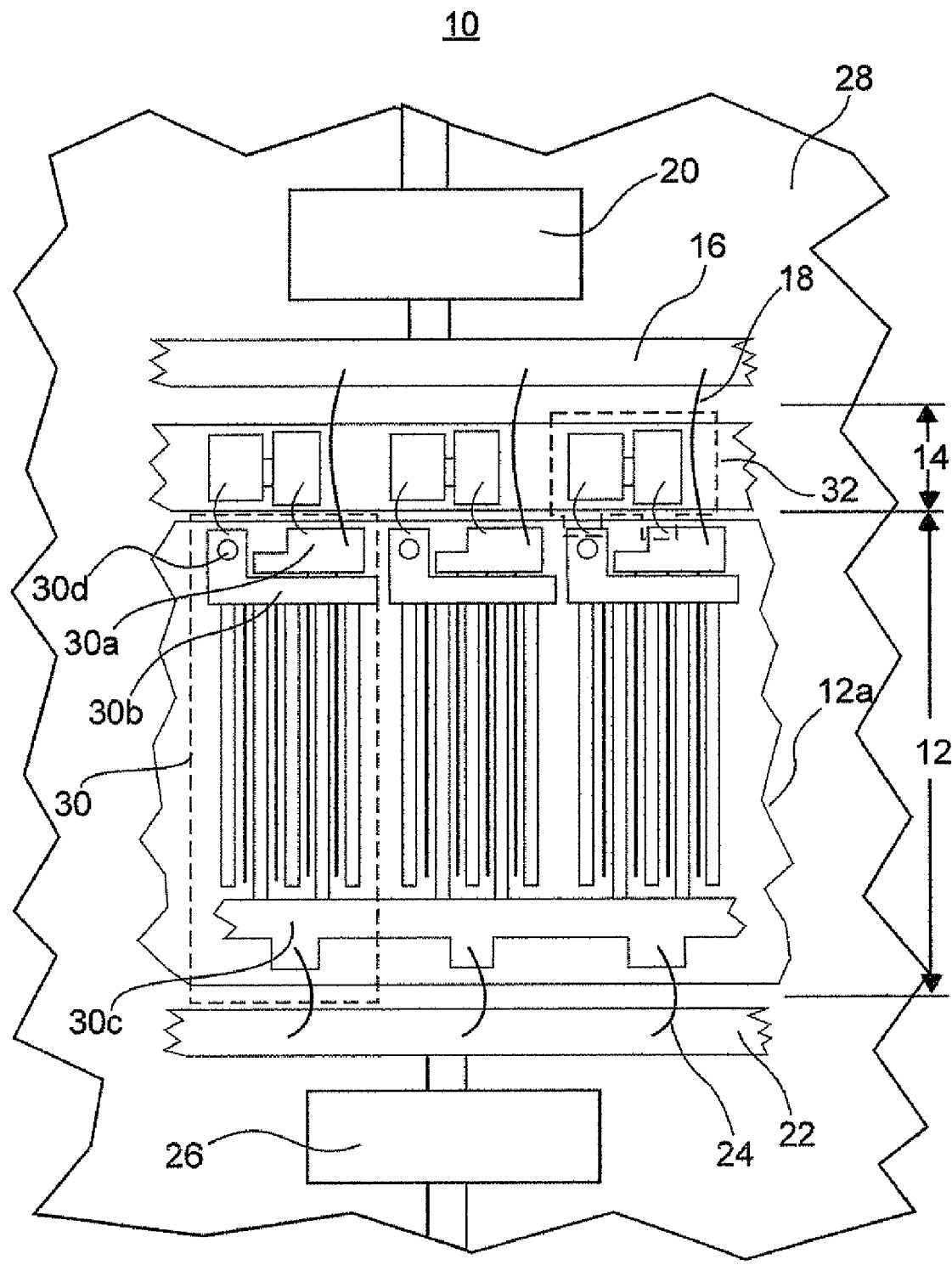
FIG. 1 is a plan view of a portion of a high-frequency power amplifier according to one embodiment of the present invention.
Figure 2:
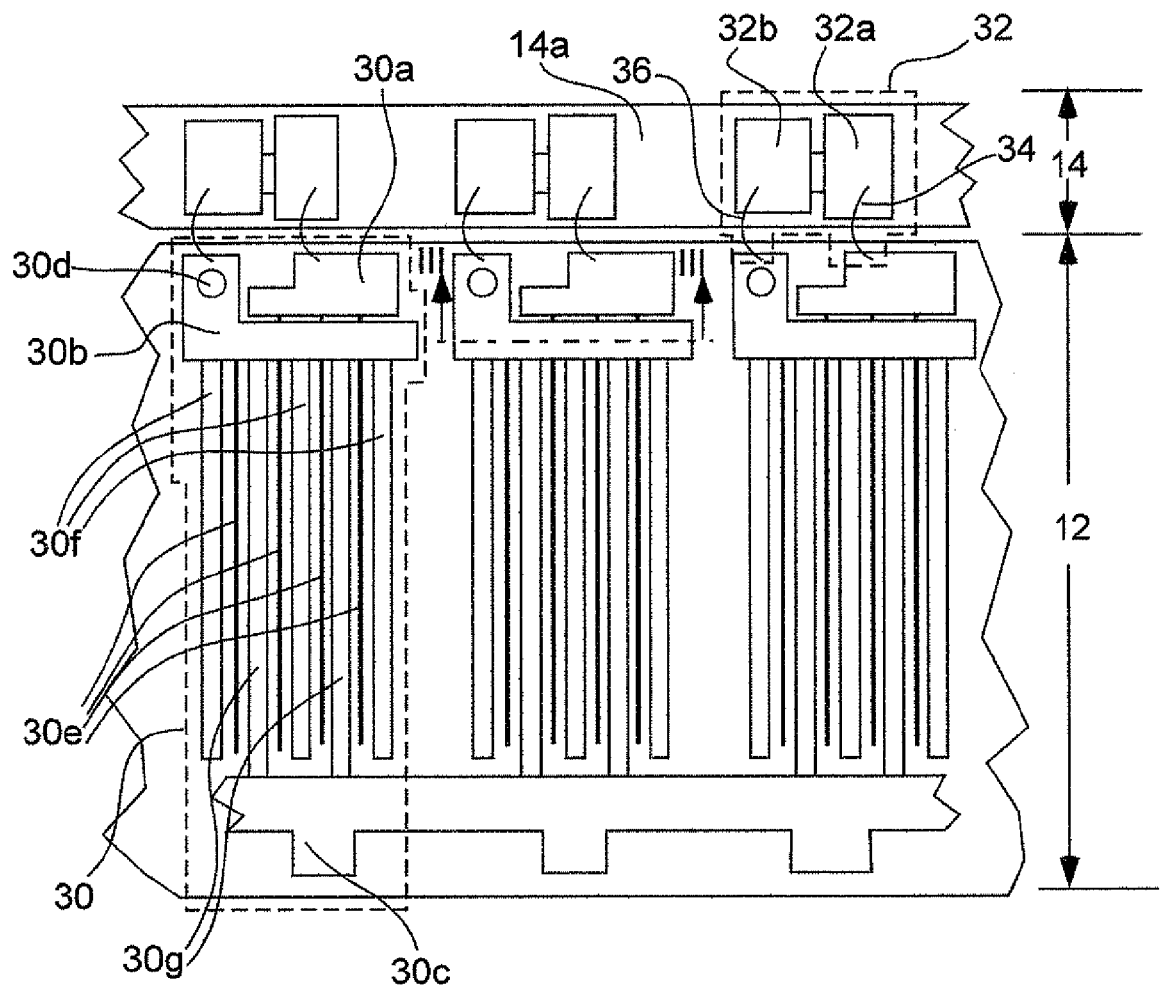
FIG. 2 is a plan view of a portion of the high-frequency power amplifier according to one embodiment of the present invention, showing a field-effect transistor (FET) element and a high-frequency processing circuit.

FIG. 1 is a plan view of a portion of a high-frequency power amplifier according to one embodiment of the present invention. FIG. 2 is a plan view of a portion of the high-frequency power amplifier according to one embodiment of the present invention, showing a field-effect transistor (FET) element and a high-frequency processing circuit.

Referring to FIG. 1, a high-frequency power amplifier 10 has an FET element 12 serving as a transistor element, a high-frequency processing circuit 14, gate connection wiring 16 and wires 18 serving as first connection line, an input matching circuit 20 connected to the gate connection wiring 16, drain connection wiring 22 and wires 24 serving as second connection line, as well as an output matching circuit 26 connected to the drain connection wiring 22. These components are disposed on a surface of a metallic substrate, e.g., a PHS 28 formed of copper tungsten.

The FET element 12 has a plurality of unit FETs 30 serving as unit transistors on an integral GaAs substrate 12a serving as a first semiconductor substrate. The unit FETs 30 are connected in parallel with each other.

Each unit FET 30 has a gate pad 30a serving as a control terminal, a source pad 30b serving as a first terminal, and a drain pad 30c serving as a second terminal.

The gate pads 30a of the unit FETs 30 are connected in common to the gate connection wiring 16 by the wires 18. The gate connection wiring 16 is further connected to the input matching circuit 20.

In this embodiment, the source pad 30b of each unit FET 30 is connected to, e.g., a grounding end serving as a constant-potential end, via a via hole 30d.

Also, in this embodiment, the drain pad 30c is integrally formed instead of being divided in correspondence with the unit FETs 30. However, each drain pad 30 c is connected in common to the drain connection wiring 22 via the wires 24. The drain connection wiring 22 is connected to the output matching circuit 26.

Referring to FIG. 2, each unit FET 30 is constructed, for example, by connecting a plurality of field-effect transistors in parallel with each other in multifinger form. Ends of a group of gate fingers 30e are connected in common to the gate pad 30a of the unit FET 30.

Similarly, ends of a group of source fingers 30f adjacent to the group of gate fingers 30e connected in common to the gate pad 30a are connected in common to the source pad 30b of the unit FET 30.

Similarly, ends of a group of drain fingers 30e adjacent to the group of gate fingers 30e connected in common to the gate pad 30a are connected in common to the drain pad 30c.

The high-frequency processing circuit 14 includes a plurality of series resonance circuits 32 serving as first series resonance circuits corresponding to the unit FETs 30 on a GaAs substrate 14a serving as a second semiconductor substrate adjacent to the unit FETs 30.

In this embodiment, one end of each series resonance circuit 32 is connected to the gate pad 30a by a wire 34, while the other end of the series resonance circuit 32 is connected to a via hole 30d by a wire 36. That is, the series resonance circuit 32 is shunt-connected between the gate pad 30a and the grounding end.

In the series resonance circuit 32, a capacitor 32a formed of, for example, a metal-insulator-metal (MIM) capacitor and an inductor 32b formed of, for example, a spiral inductor are connected in series.

Since in the embodiment shown in FIG. 2 the series resonance circuit 32 is connected to the gate pad 30a by the wire 34 and to the via hole 30d by the wire 36, these wires 34 and 36 are also included in the inductor 32b of the series resonance circuit 32.

Figure 3:
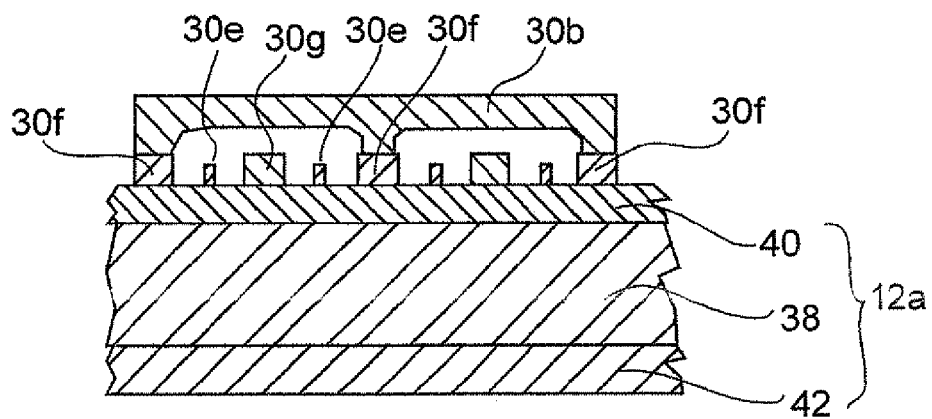
FIG. 3 is a sectional view of a portion of a source pad taken along line III-III in FIG. 2.

FIG. 3 is a sectional view of a portion of a source pad taken along line III-III in FIG. 2.

Referring to FIG. 3, the source pad 30b has an air-bridge structure. The source pad 30b has its leg portions joined to the source fingers 30f and straddles the gate fingers 30e and the drain fingers 30g, with air spaces provided therebetween.

The GaAs substrate 12a includes a GaAs substrate main body 38, a GaAs epitaxial layer 40 which is formed by epitaxial growth of GaAs on the surface of the GaAs substrate main body 38, and in which an active layer is formed, and an Au layer 42 formed on the back surface of the GaAs substrate main body 38. The Au layer 42 of the GaAs substrate 12a is joined to the surface of the PHS 28 by a joining material such as solder.

The construction of the GaAs substrate 14a on which the series resonance circuits 32 are formed is the same as that of the GaAs substrate 12a. The GaAs substrate 14a is also joined to the surface of the PHS 28 by a joining material.

Figure 4:
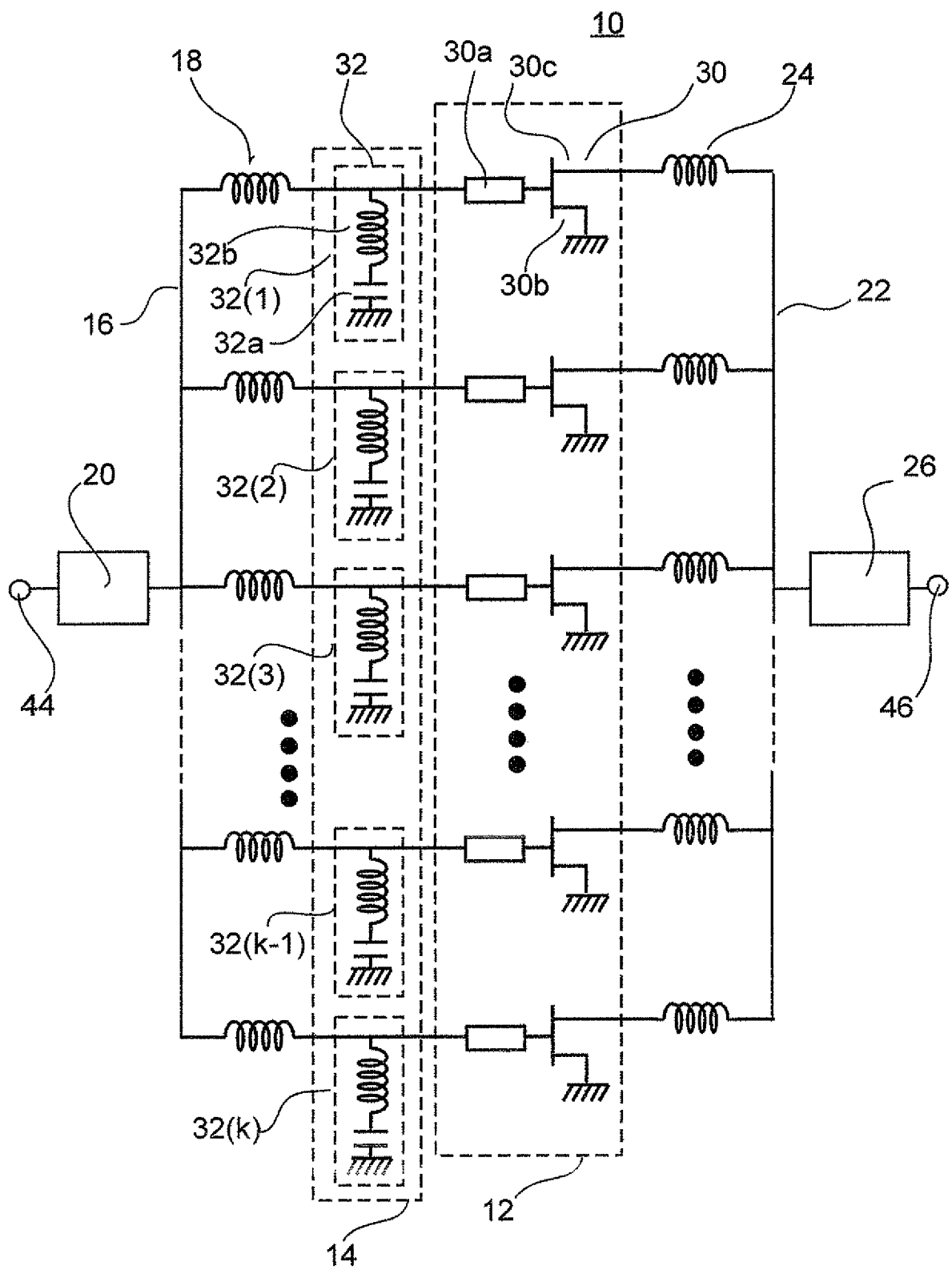
FIG. 4 is an equivalent circuit diagram of the high-frequency power amplifier according to one embodiment of the present invention.

FIG. 4 is an equivalent circuit diagram of the high-frequency power amplifier according to one embodiment of the present invention.

In FIG. 4, the circuit elements in the equivalent circuit diagram of the high-frequency power amplifier 10 and the components of the high-frequency power amplifier 10 shown in FIGS. 1 and 2 are indicated in correspondence with each other by the same reference characters. A signal input terminal 44 and a signal output terminal 46 are provided in addition to the above-described components. The series resonance circuits 32 are temporarily numbered with 32(1), 32(2), 32(3), ..., 32(k−1), 32(k) in sequence from the uppermost position in the circuit diagram.

Each resonance circuit 32 is set as a high-frequency resonance circuit resonant with the second or higher harmonic of an operating frequency in an operating frequency band. The series resonance circuit 32 is connected to the gate electrode of the corresponding unit FET 30 via the gate pad 30a.

In the conventional arrangement, a circuit for controlling a harmonic is placed not inside a transistor element but as an external circuit element for the transistor element. In contrast, in the high-frequency power amplifier 10 according to this embodiment, each series resonance circuit 32 set as a high-frequency resonance circuit resonant with the second or higher harmonic of an operating frequency is shunt-connected between the gate electrode of the corresponding unit FET 30 constituting the FET element 12 and the grounding end. That is, the series resonance circuit 32 is shunt-connected on the internal circuit side of the FET element 12 itself.

With the conventional arrangement, it was difficult to obtain a low-impedance load with respect to harmonics. However, in the high-frequency power amplifier 10, each series resonance circuit 32 having the desired harmonic resonance frequency is shunt-connected between the gate electrode of the corresponding unit FET 30 constituting the FET element 12 and the grounding end and is set so as to resonate with the desired frequency, thereby ensuring that the harmonics load with respect to the second or higher harmonic of the operating frequency can be easily controlled to a lower impedance as seen from the gate side of the FET element 12.

Further, the FET element 12 has a certain operating frequency bandwidth and, therefore, not only operating frequency but second or higher harmonic frequency also has a bandwidth. There is, therefore, a need to control the input load throughout a wide band. For this reason, the series resonance circuits 32 having different resonance frequencies corresponding to the second or higher harmonics of the operating frequency band are mixedly arranged in the high-frequency processing circuit 14.

FIGS. 5A to 5C are diagrams schematically showing the resonance frequencies of the series resonance circuits of the high-frequency power amplifier according to the present invention.

In FIGS. 5A to 5C, fa, fb and fc denote the resonance frequencies of the series resonance circuits 32; f1 denotes the operating frequency at the lower limit of the operating frequency band of the high-frequency power amplifier 10; and f2 denotes the operating frequency at the upper limit of the operating frequency band of the high-frequency power amplifier 10.

Referring to FIG. 5A, the resonance frequency fa of one of the series resonance circuits 32 corresponds to the second harmonic 2f1 of the operating frequency f1 at the lower limit of the operating frequency band of the high-frequency power amplifier 10, and the resonance frequency fb of another of the series resonance circuits 32 corresponds to the second harmonic 2fb of the operating frequency f2 at the upper limit of the operating frequency band of the high-frequency power amplifier 10.

Referring to FIG. 5B, the resonance frequency fa of one of the series resonance circuits 32 corresponds to a median value (3f1+f2)/2 between the frequency (f1+f2) of the second harmonic of a median value (f1+f2)/2 between the lower-limit operating frequency f1 and the upper-limit operating frequency f2 in the operating frequency band of the high-frequency power amplifier 10, and the second harmonic 2f1 of the lower-limit operating frequency f1 in the operating frequency band of the high-frequency power amplifier 10, and the resonance frequency fb of another of the series resonance circuits 32 corresponds to a median value (f1+3f2)/2 between the frequency (f1+f2) of the second harmonic of a median value (f1+f2)/2 between the lower-limit operating frequency f1 and the upper-limit operating frequency f2 in the operating frequency band of the high-frequency power amplifier 10, and the second harmonic 2f2 of the upper-limit operating frequency f2 in the operating frequency band of the high-frequency power amplifier 10.

In these two cases, if the resonance frequency of the series resonance circuit 32(1) for example is fa, the series resonance circuits 32 having the resonance frequencies f(a) and f(b) are alternately disposed such that the resonance frequency of the series resonance circuit 32(2) is fb, the resonance frequency of the series resonance circuit 32(3) fa, and the resonance frequency of the series resonance circuit 32(4) fb. If 2 is included as a measure of k in the series resonance circuits 32(k), the resonance frequency of the series resonance circuit 32(k−1) is set to fa and the resonance frequency of the series resonance circuit 32(k) to fb.

Thus, series resonance circuits 32 having different resonance frequencies are alternately arranged in good balance in the high-frequency processing circuit 14 to enable the FET element 12 to operate uniformly as a whole.

FIG. 5C shows a case where three frequencies fa, fb and fc are set as the resonance frequencies of the series resonance circuits 32.

In this case, the resonance frequency fa for example is set to the second harmonic 2f1 of the lower-limit operating frequency f1 in the operating frequency band of the high-frequency power amplifier 10; the resonance frequency fb is set to the frequency (f1+f2) of the second harmonic of a median value (f1+f2)/2 between the lower-limit operating frequency f1 and the upper-limit operating frequency f2 in the operating frequency band of the high-frequency power amplifier 10; and the resonance frequency fc is set to the second harmonic 2f2 of the upper-limit operating frequency f2 in the operating frequency band of the high-frequency power amplifier 10.

Also in this case, the resonance frequency of the series resonance circuit 32(1) is set to fa; the resonance frequency of the series resonance circuit 32(2) is set to fb; the resonance frequency of the series resonance circuit 32(3) is set to fc; and the resonance frequencies of the other series resonance circuits 32 are set so that the resonance frequencies fa, fb, and fc are repeated successively and alternately.

If 3 is included as a measure of k in the series resonance circuits 32(k), the resonance frequency of the series resonance circuit 32(k−2) is set to fa, the resonance frequency of the series resonance circuit 32(k−1) to fb, and the resonance frequency of the series resonance circuit 32(k) to fc.

Other cases including a case where the resonance frequency fa is set to 2f1, the resonance frequency fb to 2f2, and the resonance frequency fc to f1+f2 are conceivable. A combination of resonance frequencies may be selected by considering the Q value of the series resonance circuits, such that a distortion characteristic with improved flatness is obtained.

While the cases where two or three frequencies are set as resonance frequencies have been described, a larger number of resonance frequencies may be set.

In the case where the series resonance circuit 32 is added to each unit FET 30 of the FET element 12, the numbers of unit FETs 30 and the number of series resonance circuits 32 are equal to each other. It is desirable also from the viewpoint of uniformly operating the entire FET element 12 to set the number of resonance frequencies of the series resonance circuits 32 to a measure of the number of unit FETS 30.

In the FET element 12 of this embodiment, the series resonance circuit 12 is added to each unit FET 30. In principle, it is desirable to add the series resonance circuit 32 to each unit FET 30 in the FET element 12. However, addition of the series resonance circuit 32 to all the unit FETs 30 is not necessarily required.

FIG. 6 is a graph showing distortion characteristics of the high-frequency power amplifier according to the present invention with respect to the operating frequency.

In FIG. 6, the abscissa represents the standardized operating frequency and the ordinate represents adjacent channel leakage power (adjacent channel power ratio, hereinafter referred to as ASPR), the unit of which is dBc. Thus, FIG. 6 shows changes in ACPR with respect to the standardized operating frequency, in other words, variation in distortion.

Also, Δf indicates a frequency region of ±2% about the center frequency in the operating frequency band.

A curve "a" shown in solid line in FIG. 6 relates to the FET element 12 in this embodiment, i.e., the case where the series resonance circuit 32 is added to each unit FET 30; the resonance frequencies of the series resonance circuit 32 are fa and fb; the series resonance circuit 32 having these frequencies are alternately disposed mixedly.

Curves "b" and "c" are shown for comparison with curve "a". Curve "b" shown in broken line corresponds to a case where all the resonance frequency of the series resonance circuit added to each FET element 12 are set to fa.

Curve "c" shown in broken line corresponds to a case where all the resonance frequency of the series resonance circuit added to each FET element 12 are set to fb.

The resonance frequency fa of the series resonance circuit indicated by curve "b" corresponds to the second harmonic of the center frequency in the operating frequency band, and the resonance frequency fb of the series resonance circuit indicated by curve "c" has a resonance frequency about 3% higher than fa, as shown in FIG. 6.

In the high-frequency processing circuit 14 corresponding to curve "a", the series resonance circuits 32 having the resonance frequency fa corresponding to curve "b" and the series resonance circuits 32 having the resonance frequency fb corresponding to curve "c" are alternately disposed mixedly.

If the operating frequency is changed in the operating frequency band, the second harmonic is changed and the load at the second harmonic is changed with the change in the second harmonic resulting in a change in distortion characteristic.

As shown in curve "a", in the case where the series resonance circuits 32 having the resonance frequencies fa and fb are mixedly disposed, the minimum value of the ACPR is slightly higher than that indicated by curve "b" corresponding to the case where only the series resonance circuits having the resonance frequency fa are provided or that indicated by curve "c" corresponding to the case where only the series resonance circuits having the resonance frequency fb are provided. However, the change in ACPR with the change in operating frequency is small. That is, it can be understood that, with respect to curve "a", the flatness of the distortion characteristic is improved in a frequency region of ±2% about the center frequency in the operating frequency band.

Therefore, the input load at a harmonic can be controlled throughout a wide band as well as a high-frequency power amplifier with low distortion in wide operating frequency band can be constructed by suitably selecting the resonance frequencies fa and fb of the series resonance circuits 32 having the second or higher harmonic of the operating frequency as resonance frequencies and by suitably mixing the series resonance circuits 32 having these resonance frequencies in the high-frequency processing circuit 14.

While the selection of a frequency in the vicinity of the second harmonic of the operating frequency as the resonance frequency of the series resonance circuit 32 has been described, a harmonic higher than the second harmonic, e.g., the third harmonic frequency may also be selected.

That is, the second harmonic of the operating frequency or a frequency in the vicinity of the second harmonic is selected as the resonance frequency fa and the third harmonic of the operating frequency or a frequency in the vicinity of the third harmonic is selected as the resonance frequency fb. Also, the series resonance circuits 32 are set so that these frequencies fa and fb are repeated successively and alternately. Adding the series resonance circuit 32 having a resonance frequency in the vicinity of the third harmonic is effective in limiting mutual modulation distortion based on a high-order harmonic such as the fifth or higher harmonic of the operating frequency.

First Example of Modification

Figure 7:
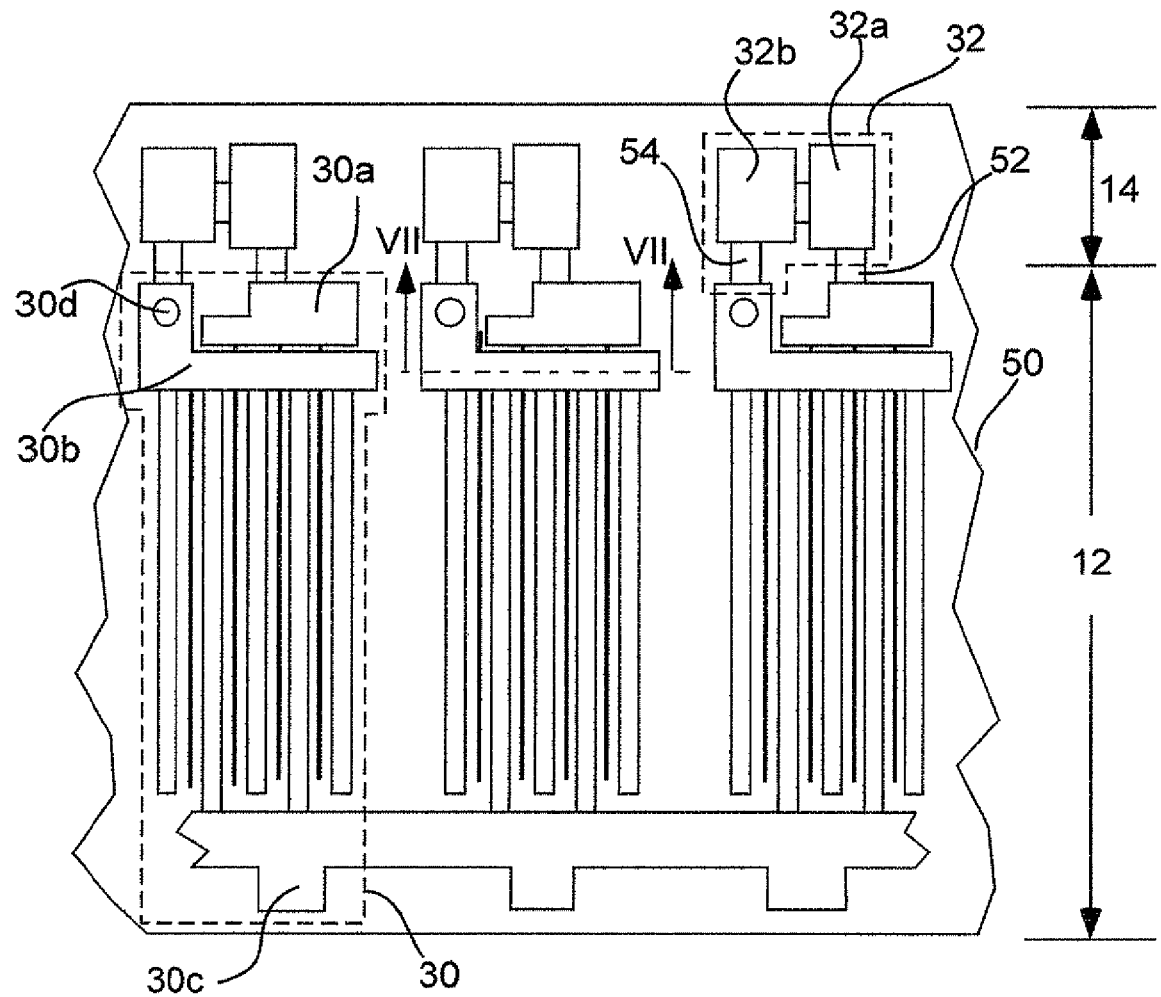
FIG. 7 is a plan view of a portion in an example of modification of the high-frequency power amplifier according to one embodiment of the present invention.

FIG. 7 is a plan view of a portion in an example of modification of the high-frequency power amplifier according to one embodiment of the present invention.

The high-frequency power amplifier shown in FIG. 7 is basically the same as the high-frequency power amplifier 10 in the first embodiment. In the high-frequency power amplifier 10, the GaAs substrate 12a of the FET element 12 and the GaAs substrate 14a of the high-frequency processing circuit 14 are formed separately from each other. In the high-frequency power amplifier in this example of modification, however, the GaAs substrate 12a and the GaAs substrate 14a are integrally formed as a GaAs substrate 50.

Accordingly, the one ends of the series resonance circuits 32 and the gate pad 30a are connected by line pattern elements 52 provided on the surface of the GaAs substrate 50 instead of the wires 34. Also, the other ends of the series resonance circuits 32 and the via holes 30d are connected by line pattern elements 54 provided on the surface of the GaAs substrate 50 instead of the wires 36.

Accordingly, each series resonance circuit 32 is formed by the capacitor 32a and the inductor 32b connected in series. Since the wire included in the inductor is removed, the series resonance circuit 32 having the resonance frequency with improved accuracy can be formed.

The sectional view taken along line VII-VII in FIG. 7 is the same as that shown in FIG. 3.

Second Example of Modification

Figure 8:
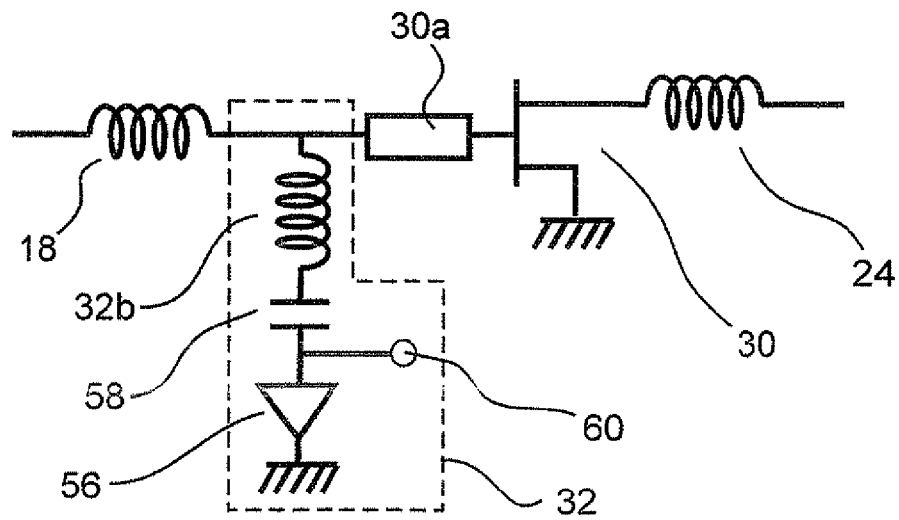
FIG. 8 is an equivalent circuit diagram showing an example of modification of the series resonance circuit of the high-frequency power amplifier according to one embodiment of the present invention.

FIG. 8 is an equivalent circuit diagram showing an example of modification of the series resonance circuit of the high-frequency power amplifier according to one embodiment of the present invention.

The series resonance circuit shown in FIG. 8 uses a diode 56 as a variable capacitor in place of the capacitor 32a in the series resonance circuit 32 shown in FIG. 4. The resonance frequency can be adjusted by using the diode 56 and changing the capacitance of the same.

In this series resonance circuit 32, a DC-cutting capacitor 58 is provided between the anode of the diode 56 and the inductor 32b for the purpose of changing the capacitance of the diode 56 by applying a DC bias, and a DC supply terminal 60 is provided between the capacitor 58 and the anode of the diode 56.

The inductance may be changed to change the resonance frequency. To do so, the inductor 32b is formed of a bonding wire and the length of the bonding wire is changed.

Second Embodiment

Figure 9:
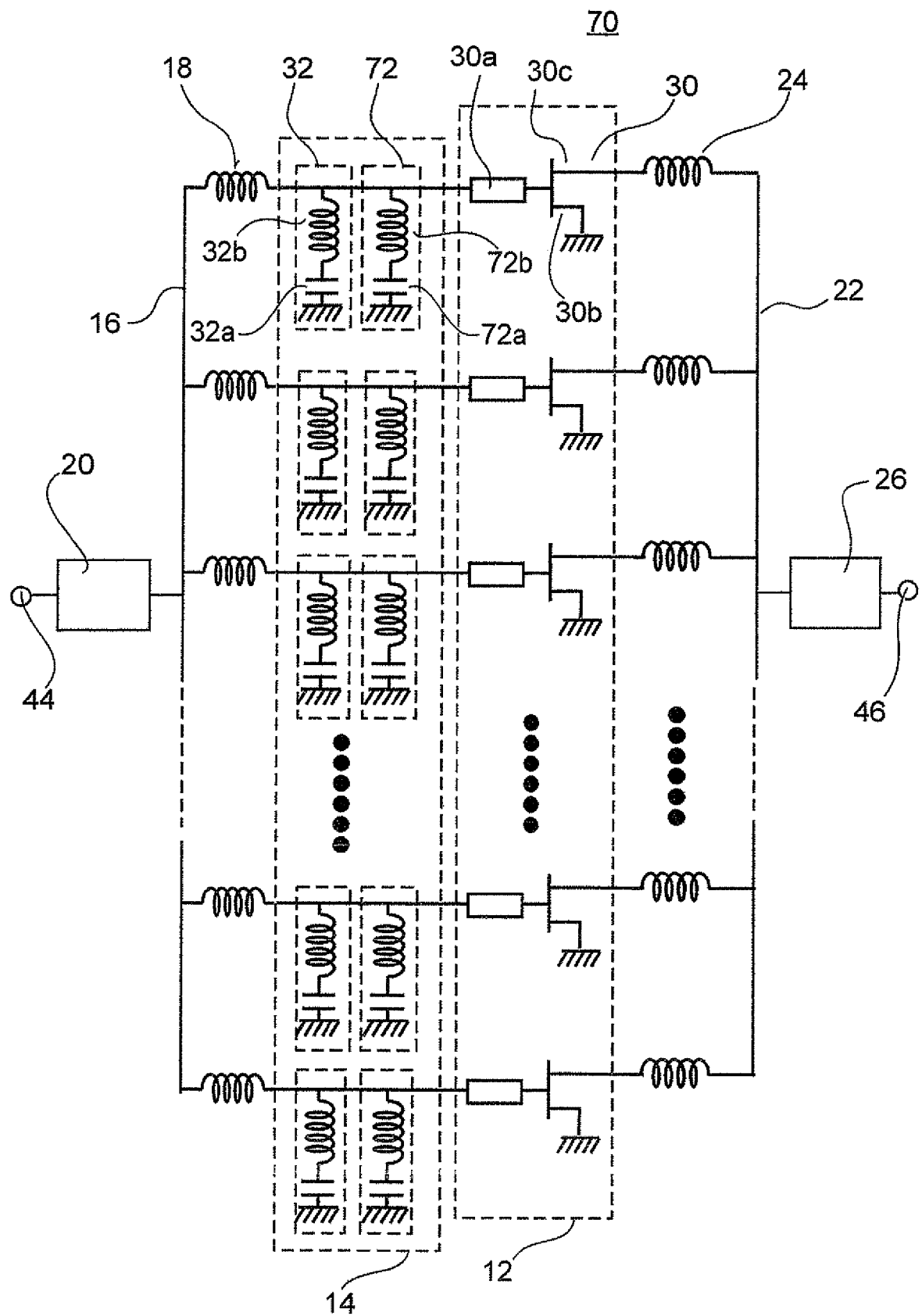
FIG. 9 is an equivalent circuit diagram of a high-frequency power amplifier according to one embodiment of the present invention.

FIG. 9 is an equivalent circuit diagram of a high-frequency power amplifier according to one embodiment of the present invention.

The construction of a high-frequency power amplifier 70 shown in FIG. 9 is basically the same as that of the high-frequency power amplifier 10 shown in FIG. 4, but the high-frequency power amplifier 70 differs from the high-frequency power amplifier 10 in that while each series resonance circuit constituting the high-frequency processing circuit 14 is provided in a single state in the high-frequency power amplifier 10, a series resonance circuit 72 serving as a second series resonance circuit is connected in parallel with each series resonance circuit 32 in the high-frequency power amplifier 70. In other respects, the construction of the high-frequency power amplifier 70 is the same as that of the high-frequency power amplifier 10.

A plurality of series resonance circuits 72 are arranged on the GaAs substrate 14a adjacent to the series resonance circuits 32. Each series resonance circuit 72 is connected in the same way as the series resonance circuit 32 by connecting one end of the series resonance circuit 72 to the gate pad 30a by a wire and by connecting the other end of the series resonance circuit 72 to the via hole 30d by a wire. That is, the series resonance circuit 72 is shunt-connected between the gate pad 30a and the grounding end.

The circuit elements constituting this series resonance circuit 72 are similar to those of the series resonance circuit 32. A capacitor 72a formed of a MIM capacitor for example and an inductor 72b formed of a spiral inductor for example are connected in series.

However, the resonance frequency of the series resonance circuit 72 differs from that of the series resonance circuit 32. As described above with reference to FIG. 5, if the series resonance circuit 32 has the resonance frequency fa, the series resonance circuit 72 is constructed to have the resonance frequency fb.

The distortion characteristics can be improved throughout a wide frequency band with respect to each unit FET 30 by providing the series resonance circuit 32 and the series resonance circuit 72 having different resonance frequencies in correspondence with the unit FET 30 as described above. Also, as described above with respect to the first embodiment, a resonance frequency selection may be made such that the resonance frequency of one of the series resonance circuits 32 and 72 is set to the second harmonic of the operating frequency or to a frequency in the vicinity of the second harmonic, while the resonance frequency of the other of the series resonance circuits 32 and 72 is set to the third harmonic of the operating frequency or to a frequency in the vicinity of the third harmonic.

While the transistor elements having field-effect transistors in multifinger form have been described, the same effect of the present invention can also be obtained in the case of application to a transistor element having bipolar transistors in multifinger form.

As described above, the high-frequency power amplifier comprises a transistor element having a plurality of unit transistors on a first semiconductor substrate, each of the unit transistors having a plurality of transistors connected in parallel with each other in multifinger form, and each of the unit transistors having a control terminal through which an input signal is input, a first terminal connected to a constant-potential end, and a second terminal through which an output signal is output; a high-frequency processing circuit having a plurality of first series resonance circuits shunt-connected between the control terminals of the unit transistors of the transistor element and the constant-potential ends, and located on a second semiconductor substrate; first connection line for connecting the plurality of control terminals of the transistor element to each other; second connection line for connecting the plurality of second terminals of the transistor element to each other; an input matching circuit connected to the first connection line; and an output matching circuit connected to the second connection line, and two of the first series resonance circuits have resonance frequencies corresponding to the second and higher harmonics of a frequency included in the operating frequency band of the transistor element, and different from each other.

In the high-frequency power amplifier thus constructed, each first series resonance circuit is shunt-connected between the control terminal of the corresponding unit transistor constituting the transistor element and the constant-potential end and is set so as to resonate with the desired frequency corresponding to the second or higher harmonic of the operating frequency. Therefore, the high-frequency load with respect to the second or higher harmonic of the operating frequency can be easily controlled to a low impedance as seen from the control terminal side of the transistor element.

Further, two of the first series resonance circuits have resonance frequencies which correspond to the second and higher harmonics of a frequency included in the operating frequency band of the transistor element, and which are different from each other. Thus, in the high-frequency processing circuit, the first series resonance circuits having two different resonance frequencies corresponding to the harmonics of the operating frequency band are mixedly provided, thereby reducing variation in distortion in the operating frequency band in comparison with a case where only resonance circuits of one resonance frequency are provided, and obtaining distortion characteristics stable throughout a comparatively wide band. Thus, a high-frequency power amplifier having high operating efficiency and improved distortion characteristics in a comparatively wide frequency band can be obtained with a simple arrangement.

Third Embodiment

Figure 10:
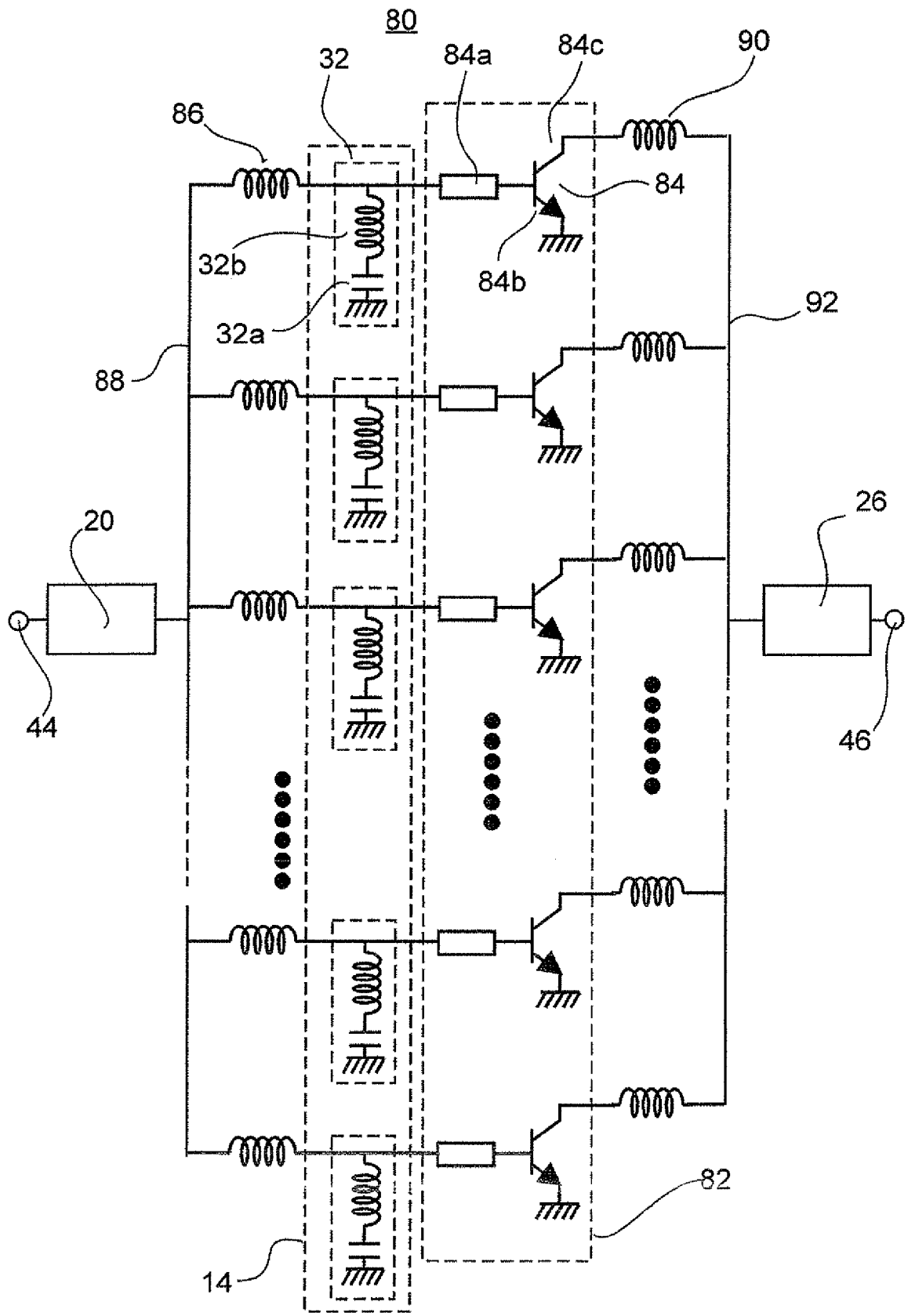
FIG. 10 is an equivalent circuit diagram of a high-frequency power amplifier according to one embodiment of the present invention.

FIG. 10 is an equivalent circuit diagram of a high-frequency power amplifier according to one embodiment of the present invention.

The construction of a high-frequency power amplifier 80 shown in FIG. 10 is basically the same as that of the high-frequency power amplifier 10 shown in FIG. 4, but the high-frequency power amplifier 80 differs from the high-frequency power amplifier 10 in that while the high-frequency power amplifier 10 uses the FET element 12 as a transistor element, the high-frequency power amplifier 80 uses a hetero junction bipolar transistor element (hereinafter referred to as "HBT element") 82.

The HBT element 82 has a plurality of unit HBTs 84 formed as unit transistors on one GaAs substrate 12a (not shown in FIG. 10) serving as a first semiconductor substrate. The unit HBTs 84 are connected in parallel with each other.

Each unit HBT 84 has a base pad 84a serving as a control terminal, an emitter pad 84b serving as a first terminal, and a collector pad 84c serving as a second terminal.

The base pads 84a of the unit HBTs 84 are connected in common to base connection wiring 88 by wires 86. The base connection wiring 88 is further connected to an input matching circuit 20.

Each emitter pad 84b is connected to a constant-potential end, e.g., a grounding end via a via hole or the like.

The collector pad 84c may be integrally formed instead of being necessarily divided in correspondence with each unit HBT 84. Wires 90 from one collector pad 84c or divided collector pads 84c are connected in common to collector connection wiring 92. The collector connection wiring 92 is connected to an output matching circuit 26.

Each unit HBT 84 is constructed by connecting a plurality of HBTs in parallel with each other in multifinger form. Ends of a group of base fingers are connected in common to the base pad 84a of the unit HBT 84.

Similarly, ends of a group of emitter fingers adjacent to the group of base fingers connected in common to the base pad 84a are connected in common to the emitter pad 84b of the unit HBT 84.

Similarly, ends of a group of collector fingers adjacent to the group of base fingers connected in common to the base pad 84a are connected in common to the collector pad 84c.

The construction of a high-frequency processing circuit 14 is the same as that described above with respect to the first embodiment. However, each series resonance circuit 32 in this embodiment has one end connected to the base pad 84a by a wire and the other end connected by a wire to a via hole provided in the emitter pad 84b. That is, the series resonance circuit 32 is shunt-connected between the base pad 84a and a grounding end.

The emitter pad 84b has an air-bridge structure. The emitter pad 84b has its leg portions joined to the emitter fingers and straddles the base fingers and the collector fingers, with air spaces provided therebetween.

Each resonance circuit 32 is set as a high-frequency resonance circuit resonant with the second or higher harmonic of an operating frequency in an operating frequency band. The series resonance circuit 32 is connected to the base electrode of the corresponding unit HBT 84 via the base pad 84a.

In other respects, the construction is the same as that of the high-frequency power amplifier in the first embodiment.

In the conventional arrangement, a circuit for controlling a harmonic is placed not inside a transistor element but as an external circuit element for the transistor element. In contrast, in the high-frequency power amplifier 80 according to this embodiment, each series resonance circuit 32 set as a high-frequency resonance circuit resonant with the second or higher harmonic of an operating frequency is shunt-connected between the base electrode of the corresponding unit HBT 84 constituting the HBT element 82 and the grounding end. That is, the series resonance circuit 32 is shunt-connected on the internal circuit side of the HBT element 82 itself.

With the conventional arrangement, it is difficult to obtain a low-impedance load with respect to harmonics. In the high-frequency power amplifier 80, each series resonance circuit 32 having the desired harmonic resonance frequency is shunt-connected between the base electrode of the corresponding unit HBT 84 constituting the HBT element 82 and the grounding end and is set so as to resonate with the desired frequency, thereby ensuring that the high-frequency load with respect to the second or higher harmonic of the operating frequency can be easily controlled to a low impedance as seen from the base side of the HBT element 82. In this case, the resonance frequencies of all the series resonance circuits 32 may be equal to each other.

Further, if the HBT element 82 has a certain operating frequency bandwidth, not only the operating frequency but second or higher harmonic frequency also has a certain bandwidth and there is a need to control the input load throughout a wide band.

Therefore, as described in the first embodiment, the series resonance circuits 32 having different resonance frequencies corresponding to the second or higher harmonics of the operating frequency band are set and are suitably mixed and arranged in good balance to form a high-frequency power amplifier having a wide operating frequency band and reduced distortion.

As described above, the high-frequency power amplifier comprises a transistor element having a plurality of unit transistors on a first semiconductor substrate, each of the unit transistors having a plurality of bipolar transistors connected in parallel with each other in multifinger form, and each of the unit transistors having a control terminal through which an input signal is input, a first terminal connected to a constant-potential end, and a second terminal through which an output signal is output; a high-frequency processing circuit having a plurality of first series resonance circuits shunt-connected between the control terminals of the unit transistors of the transistor element and the constant-potential ends, and located on a second semiconductor substrate; first connection line for connecting the plurality of control terminals of the transistor element to each other; second connection line for connecting the plurality of second terminals of the transistor element to each other; an input matching circuit connected to the first connection line; and an output matching circuit connected to the second connection line, and the first series resonance circuits have resonance frequencies corresponding to the second or higher harmonic of a frequency included in the operating frequency band of the transistor element. The high-frequency power amplifier according to the present invention is capable of controlling the high-frequency load with respect to the second or higher harmonic of the operating frequency to a lower impedance. As a result, the high-frequency power amplifier can be formed so as to have a higher output and improved efficiency.

Further, two of the first series resonance circuits may be set to have resonance frequencies which correspond to the second and higher harmonics of a frequency included in the operating frequency band of the transistor element, and which are different from each other, and thereby distortion characteristics with reduced variation in a relatively wide band can be obtained.

Thus, a high-frequency power amplifier having a higher output, high operating efficiency and improved distortion characteristics in a comparatively wide frequency band can be obtained with a simple arrangement.

As described above, the high-frequency power amplifier according to the present invention is suitable for use in communication apparatuses used in microwave and milliwave bands for mobile communication, satellite communication or the like.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A high-frequency power amplifier comprising:
    a transistor element having a plurality of unit transistors on a first semiconductor substrate, each of the unit transistors having a plurality of transistors connected in parallel with each other in multifinger form, and each of the unit transistors having a control terminal through which an input signal is input, a first terminal connected to a constant-potential end, and a second terminal through which an output signal is output;
    a high-frequency processing circuit having a plurality of first series resonance circuits shunt-connected between the control terminals of the unit transistors of the transistor element and the constant-potential ends, and located on a second semiconductor substrate;
    a first connection line connecting the plurality of control terminals of the transistor element to each other;
    a second connection line connecting the plurality of second terminals of the transistor element to each other;
    an input matching circuit connected to the first connection line; and
    an output matching circuit connected to the second connection line, wherein two of the first series resonance circuits have respective different resonance frequencies corresponding to second and higher harmonics of respective frequencies that are included in an operating frequency band of the transistor element.

2. The high-frequency power amplifier according to claim 1, wherein one of the first series resonance circuits is connected to each of the unit transistors.

3. The high-frequency power amplifier according to claim 1, wherein the number of respective resonance frequencies different from each other in the first series resonance circuits is an integer factor of the number of unit transistors in the transistor element.

4. The high-frequency power amplifier according to claim 1 further comprising a plurality of second series resonance circuits on the second semiconductor substrate, shunt-connected between the control terminal of the unit transistor and the constant-potential end, in parallel with the first series resonance circuit, wherein two of the second series resonance circuits have respective different resonance frequencies corresponding to second and higher harmonics of respective frequencies included in the operating frequency band of the transistor element.

5. The high-frequency power amplifier according to claim 4, wherein the number of the resonance frequencies different from each other in the second series resonance circuits is an integer factor of the number of the unit transistors in the transistor elements.

6. The high-frequency power amplifier according to claim 1, wherein the first semiconductor substrate and the second semiconductor substrate are integral with each other.

7. A high-frequency power amplifier comprising:
    a transistor element having a plurality of unit transistors on a first semiconductor substrate, each of the unit transistors having a plurality of bipolar transistors connected in parallel with each other in multifinger form, and each of the unit transistors having a control terminal through which an input signal is input, a first terminal connected to a constant-potential end, and a second terminal through which an output signal is output;

a high-frequency processing circuit having a plurality of first series resonance circuits shunt-connected between the control terminals of the unit transistors of the transistor element and the constant-potential ends, and located on a second semiconductor substrate;

a first connection line connecting the plurality of control terminals of the transistor element to each other;

a second connection line connecting the plurality of second terminals of the transistor element to each other;

an input matching circuit connected to the first connection line; and an output matching circuit connected to the second connection line, wherein the first series resonance circuits have respective resonance frequencies corresponding to second or higher harmonics of respective frequencies included in an operating frequency band of the transistor element.

8. The high-frequency power amplifier according to claim 7, wherein the first semiconductor substrate and the second semiconductor substrate are integral with each other.

* * * * *